United States Patent [19]

Takashima

[11] Patent Number: 5,060,111
[45] Date of Patent: Oct. 22, 1991

[54] RADIAL TYPE OF PARALLEL SYSTEM BUS STRUCTURE

[75] Inventor: Tokuhei Takashima, Tokyo, Japan

[73] Assignee: Graphico Co., Ltd., Tokyo, Japan

[21] Appl. No.: 507,194

[22] Filed: Apr. 10, 1990

[30] Foreign Application Priority Data

Apr. 21, 1989 [JP] Japan .................................. 1-102909

[51] Int. Cl.[5] .............................................. H05K 7/20
[52] U.S. Cl. ................................... 361/384; 165/80.3; 361/413; 439/65; 439/74
[58] Field of Search .......................... 439/59, 61, 62, 65, 439/74, 76, 485; 174/16.1; 165/80.3, 104.34, 122; 361/382, 383, 384, 386, 396, 409, 410, 412, 413, 415, 407

[56] References Cited

U.S. PATENT DOCUMENTS

| | | | |
|---|---|---|---|
| 3,504,268 | 3/1970 | Hoffman | 361/382 |
| 3,794,784 | 2/1974 | Snider | 200/11 A |
| 3,812,381 | 5/1974 | Guyton | 361/412 |
| 3,967,874 | 7/1976 | Calabro | 361/384 |
| 4,399,484 | 8/1983 | Mayer | 361/382 |
| 4,888,663 | 12/1989 | Longerich | 361/382 |

Primary Examiner—Gerald P. Tolin
Attorney, Agent, or Firm—Birch, Stewart, Kolasch & Birch

[57] ABSTRACT

Disclosed is an improved parallel system bus structure comprising a plurality of bus wire-printed disks each having a plurality of signal conductors of equal length extending radially from a common central contact. These bus disks are spaced vertically at regular intervals, and a plurality of connectors are fixed to the circumferences of the bus disks to permit connection between the signal conductors of the bus disks and the terminals of the CPU board. The radial arrangement of signal conductors permits connection of selected CPU boards via equal length of signal path, no matter how many CPU boards may be used. Therefore, no timed control is required in transmission of signals between selected CPU boards via the bus, and accordingly communication speed will be increased to meet highly functional computer's requirements.

4 Claims, 7 Drawing Sheets

RADIAL TYPE OF PARALLEL SYSTEM BUS STRUCTURE

BACKGROUND OF THE INVENTION

1. Field of the Invention

The present invention relates to an exterior bus for a microprocessor computer.

2. Description of the Prior Art

A conventional hardwear structure of multi-microcompute system uses a plurality of CPU boards each having a central processing unit built thereon, and these CPU boards are mounted in a frame with their main surfaces parallel with each other. The lead conductors which are terminated at the inside edge of each CPU board, are connected to a bus cable extending behind the frame via an appropriate connector.

In the conventional multi-microcomputer system a plurality of CPU boards are arranged with their main surfaces parallel with each other to form a single line, and these CPU boards are connected to a single bus cable. As a consequence the distance between two CPU boards selected among a series of boards may depend on which positions such CPU boards are put, varying greately with the increase of the number of the series-connected boards. In case of communication between selected CPU boards via the bus cable, the signal path whose length is dependent on which boards are selected, must be taken into consideration for well-timed operation.

As shown in FIG. 13, a plurality of air conditioning fans 21 are arranged along the line of CPU boards 20. CPU boards which are positioned near each fan will be cooled more than those which are positioned far from each fan, and therefore, it is difficult that all CPU boards are cooled evenly and kept at same temperature.

SUMMARY OF THE INVENTION

One object of the present invention is to provide an improved parallel system bus structure which permits inter-board signal path to be equal and as short as possible regardless of the number of CPU boards used, thereby simplifying signal transmission controlling, and increasing the inter-CPU board communication speed to possible maximum.

Another object of the present invention is to provide an improved parallel system bus structure which permits even cooling of all CPU boards used, thereby keeping them at a given constant temperature.

In order to attain these objects an improved parallel system bus structure according to the present invention is designed to provide a radial arrangement of CPU boards standing upright and converging towards a common center with their lead conductors connected to selected common contacts via signal wires of equal length.

According to the first aspect of the present invention a radial type of parallel system bus structure comprises: a plurality of bus wire-printed boards each having a plurality of signal conductors of equal length extending radially from a common contact center, said bus wire-printed boards being spaced and arranged vertically along one axial line; and a plurality of stationary connectors each being connected to selected singnal conductors and being adapted to mate with the edge connector of a CPU board, and said stationary connectors being arranged around said bus wire-printed boards, whereby said structure permits connection between selected signal conductors on each bus wire-printed board and selected terminals on each of a plurality of CPU boards, which stand upright around said bus wire-printed boards.

According to the second aspect of the present invention at least one bus wire-printed board is composed of a plurality of layers each bearing a plurality of signal conductors and a common contact center connected thereto.

According to the third aspect of the present invention each bus wire-printed board has a dielectric layer bearing a plurality of ground conductors on its undersurface, extending parallel to the signal conductors on its uppersurface.

According to the fourth aspect of the present invention a radial type of parallel system bus structure comprises at least one air conditioning fan above or below the vertical arrangement of said bus wire-printed boards on its central axis.

Inter-CPU board communication will be performed via a group of radial signal conductors on the bus-printed board, which radial signal conductors are connected to the lead conductors of each CPU board. In a parallel system bus structure accoroding to the first aspect of the present invention all CPU boards are electrically connected to each other by selected two radial signal conductors. In a parallel system bus structure according to the second aspect of the present invention signal conductors are provided at an increased density. In a parallel system bus structure according to the third aspect of the present invention the signal conductors are shielded. Finally, in a parallel system bus structure according to the third aspect of the present invention all CPU boards will be evenly cooled and kept at an equal temperature.

Other objects and advantages of the present invention will be understood from the following description of preferred embodiments, which are shown in accompanying drawings.

DESCRIPTION OF PREFERRED EMBODIMENTS

As regards external buses which are designed for use in micro-processor computor systems, every manufacturing company has established standards according to which they make external buses.

Preferred embodiments of the present invention will be described as being applied to a Parallel System Bus manufactured by Intel Corp.

Figure 2:
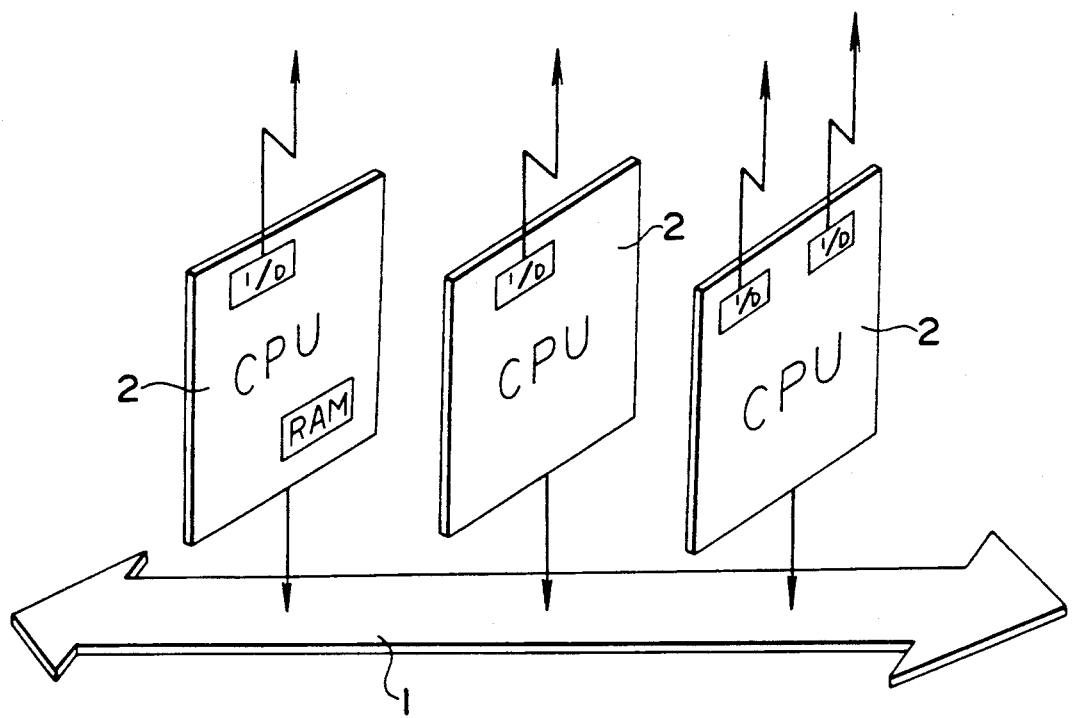
FIG. 2 is a schematic diagram showing a series-arrangement of CPU boards connected via a parallel system bus in a multi-microprocessor system.

Such multi-bus was designed for use in a multi-microprocessor system having a plurality of microprocessors built therein. As seen from FIG. 2, these microprocessors are connected to each other by a Parallel System Bus 1.

Figure 3:
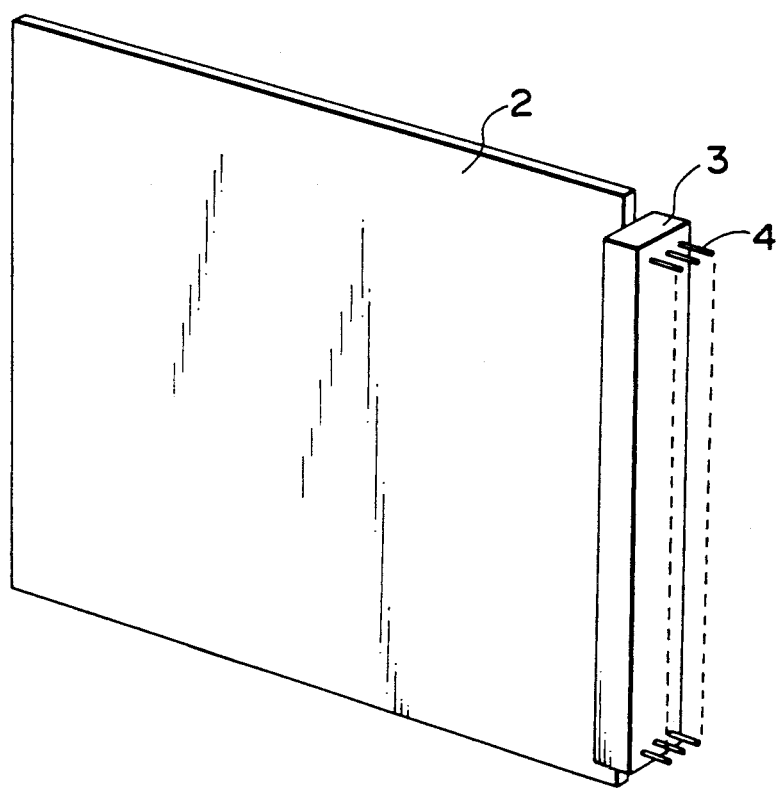
FIG. 3 is a perspective view of a CPU board.

There are two kinds of CPU boards to be used in such a multi-microprocessor system, i.e., one ("Single-High Board") equipped with a single board connector 3 on its terminal edge (See FIG. 3), and the other("Double-High Board") equipped with two board connectors on its terminal edge.

A board connector 3 has 32 connector pins 4 arranged each in three lines (96 connector pins in total).

Figure 4:
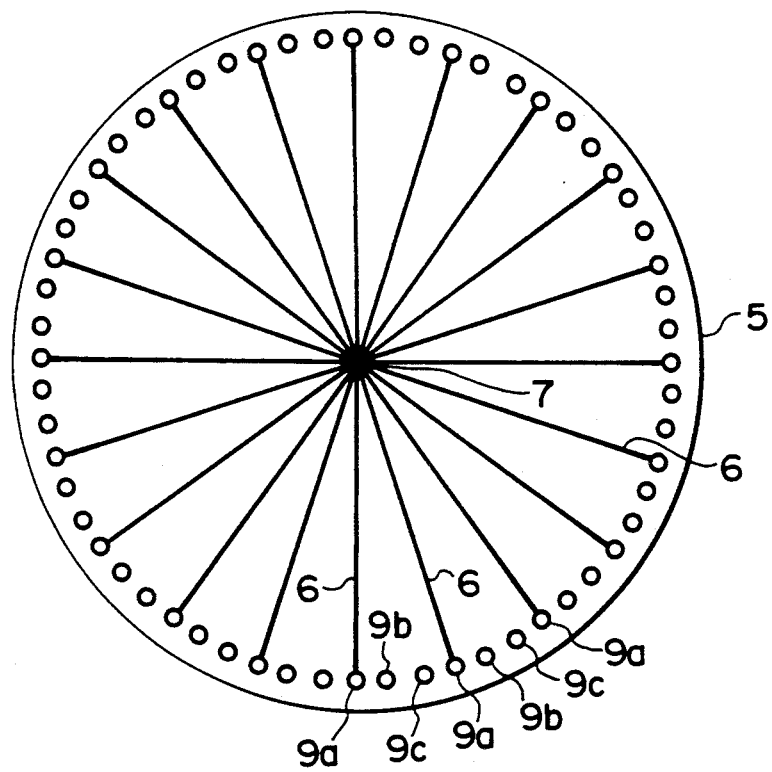
FIG. 4 is a plane view showing the radial arrangement of signal conductors printed on a selected layer of the bus-printed board.

FIG. 4 is a plane view of the upper layer in a three-layer bus-printed board 5, which is made of epoxy resin. Signal conductors are indicated at 6; and terminals for the signal conductors in the upper layer, intermediate layer and lower layer are indicated at 9a, 9b and 9c.

Each layer has 20 signal conductors 6 of equal length extending radially from its center common contact 7 at regular angular spaces.

Figure 5:
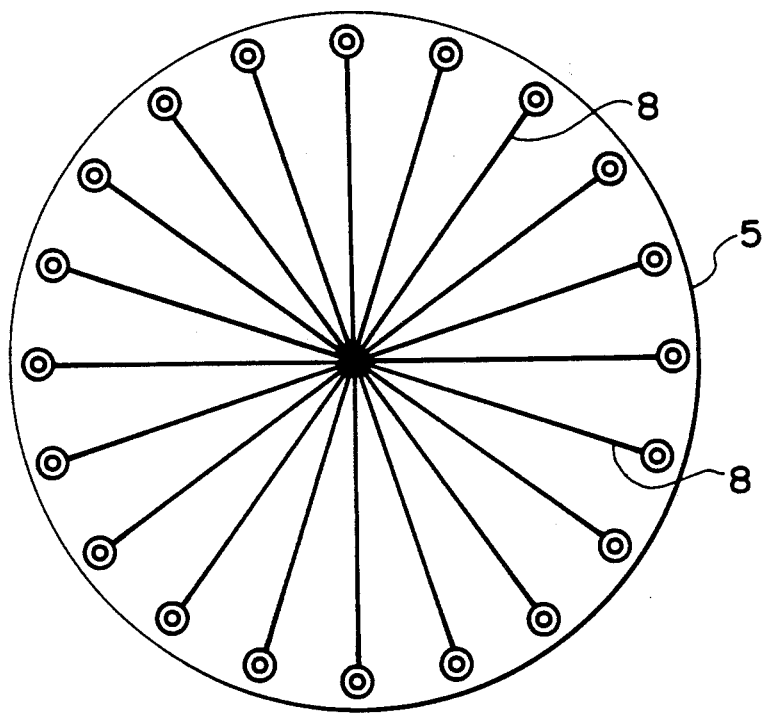
FIG. 5 is a plane view showing the radial arrangement of ground conductors printed on a selected layer of the bus-printed board.

As seen from FIG. 5, the ground conductors 8 are arranged in the same pattern as the signal conductors 6 so that they may be in registration with the overlying signal conductors 8.

Figure 6:
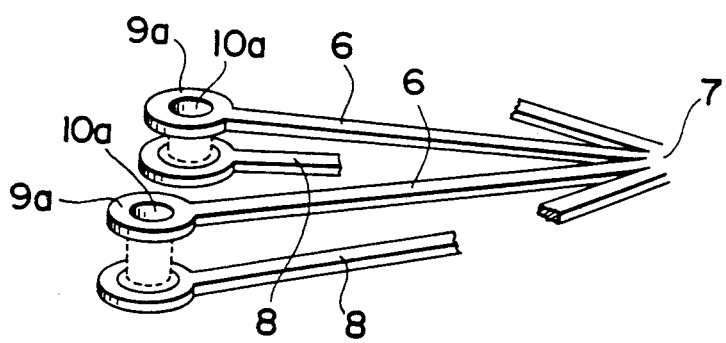
FIG. 6 is a perspective view showing signal conductors and corresponding ground conductors in overlying and underlying layers.

FIG. 6 shows diagrammatically the manner in which signal conductors 6 and corresponding ground conductors 8 are arranged at different levels in the form of lamination.

Figure 8:
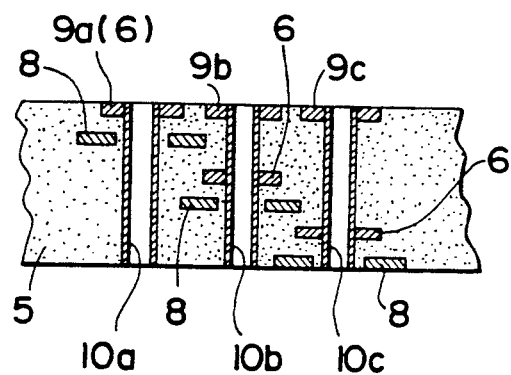
FIG. 8 is a sectional view of a bus-printed board, showing signal and ground conductors in layers at different levels.

As shown in FIG. 8 a bus-printed board 5 may be composed of three bus layers each having signal and ground conductors (or six sub-layers each having signal or ground conductors). The signal conductors 6 in each layer are arranged offset from the signal conductors 6 in the other layers, and all ground conductors 8 are grounded.

Figure 7:
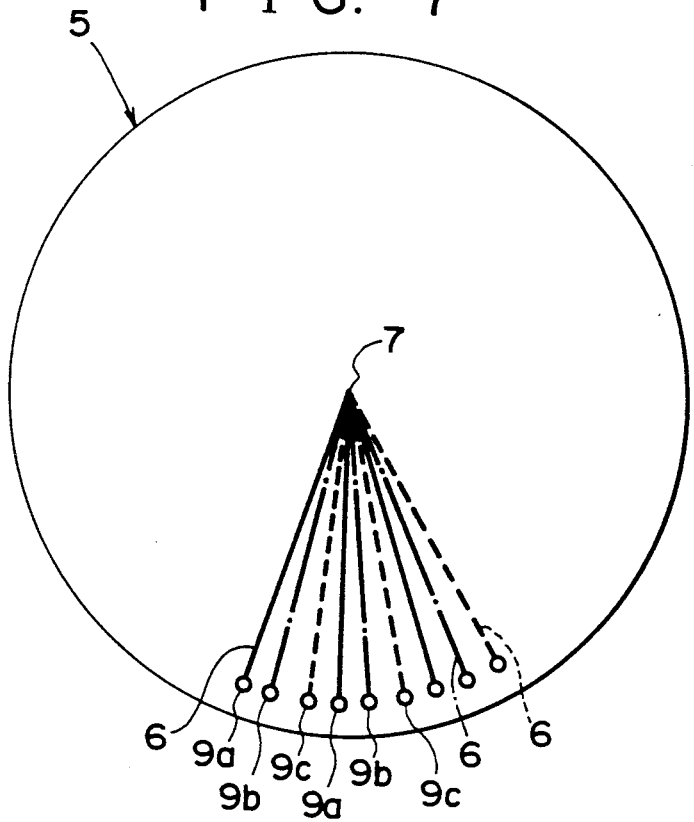
FIG. 7 is a plane view of the bus disk, showing radial arrangements of signal conductors in selected three layers at different levels.

FIG. 7 shows that the signal conductors 6 in upper layer (solid lines), intermediate layer (dot-and-dash lines) and lower layer (broken lines) are arranged offset from the signal conductors 6 in the other layers.

The end of each signal conductor 6 is electrically connected to a terminal 9a, 9b or 9c by soldering and lining its pin hole 10a, 10b or 10c with a soldering material.

A bus-printed board has 20×3 pin holes for the signal conductors 6 in three layers. Three pin holes 10a, 10b and 10c make up a single set (See FIG. 8).

Figure 9:
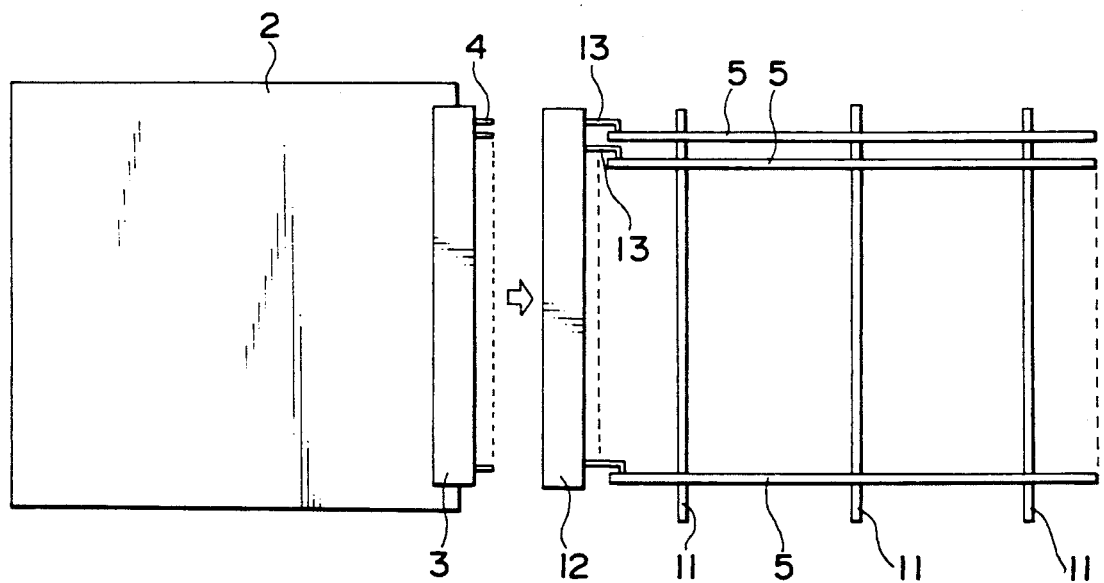
FIG. 9 is a side view of a vertical stack of bus-printed boards and a CPU board, which are to be connected together.
Figure 10:
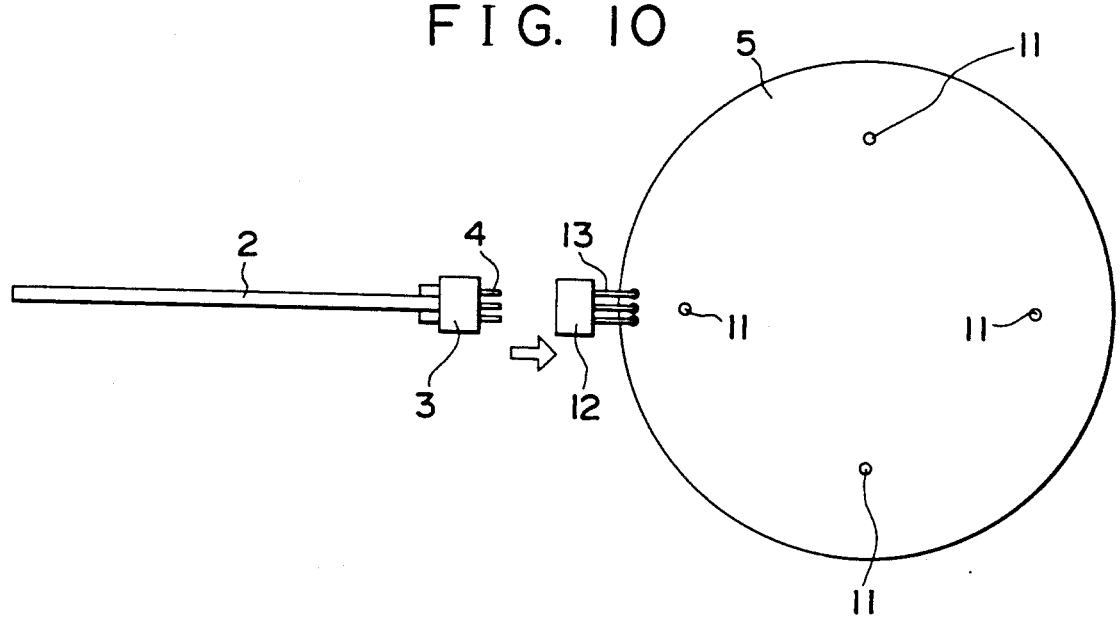
FIG. 10 is a plane view of the stack of bus-printed boards and the CPU board.

In use, twelve bus-printed boards 5 are arranged vertically at regular spaces on four support rods 11, which stand on a frame (not shown). Stationary conectors 12 are fixed to the frame, and all terminals of each stationary connector 12 are connected to the pin holes with the aid of L-shaped metals 13. CPU boards 2 standing upright are connected to the bus-printed boards 5 with their connector pins 4 inserted in the pin holes of the stationary connector 12. Then, each set of three pin holes 10a, 10b and 10c receive three pins 4 at same level (See FIGS. 9 and 10). Each CPU board 2 is held by slidably inserting its upper and lower edges in upper and lower guide slots of the frame (not shown).

Figure 1:
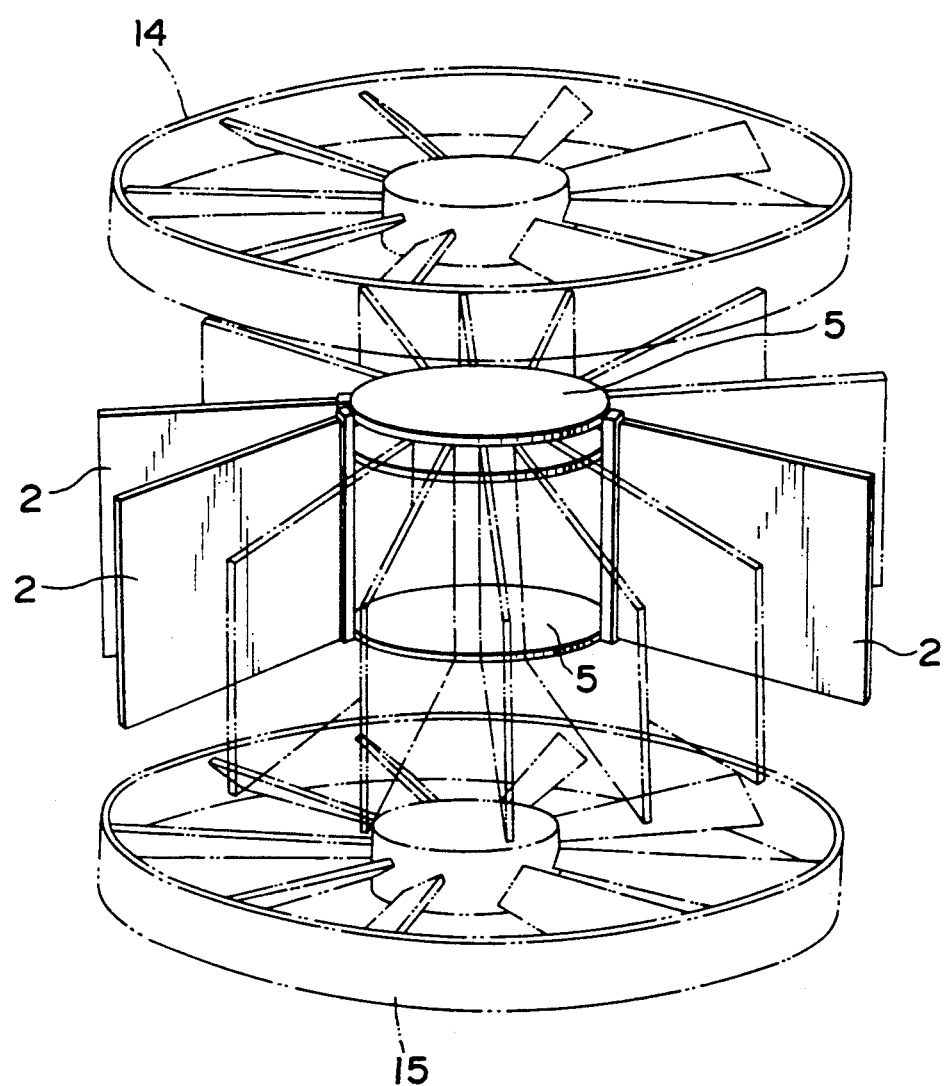
FIG. 1 is a perspective view of a radial type of parallel system bus structure according to one embodiment of the present invention.

As seen from FIG. 1, a desired number of CPU boards 2 are arranged radially on the circumferences of twelve bus-printed disks 5. Air-conditioning fans 14 and 15 are put above and below the bus-printed disk column.

The standard distance between adjacent CPU boards when connected to a Parallel System Bus is 0.8 inches (20.32 mm). A longest data bus commercially available is 16.8 inches long. Therefore, twenty CPU boards can be connected to such data bus at standard intervals of 0.8 inches, and if CPU boards of "board-add-on" type (in which type a CPU board has a small board added thereon) are used, a less number of CPU boards are permitted. In contrast, twenty CPU boards of "board-add-on" type can be connected to the circumference of a bus disk bearing spoke-like conductors because these CPU boards are arranged at regular angular intervals, leaving a divergent space between adjacent CPU boads, which divergent space is large enough to accommoadate the extra small board.

Figure 11:
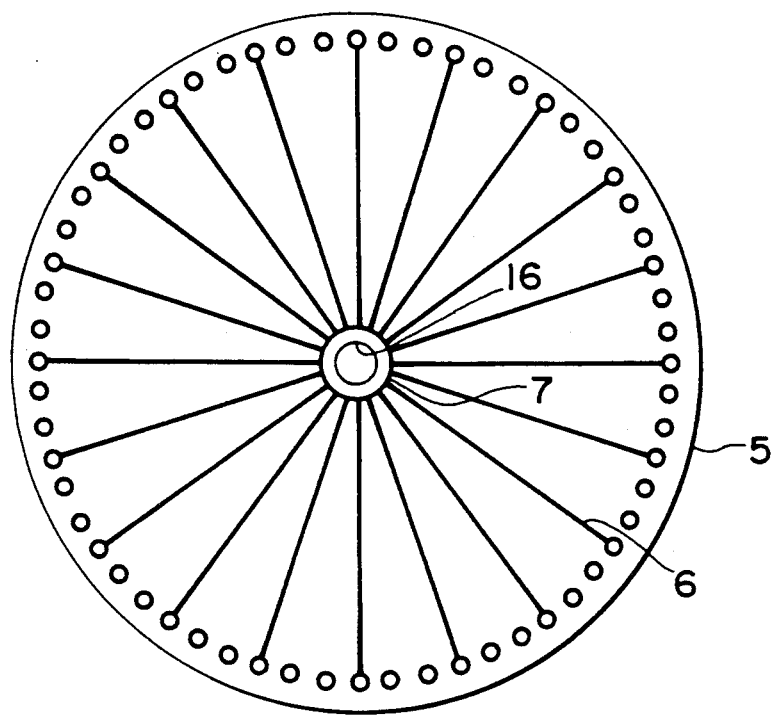
FIG. 11 is a plane view of radial arrangement of signal conductors printed on a selected layer of a bus-printed board.
Figure 12:
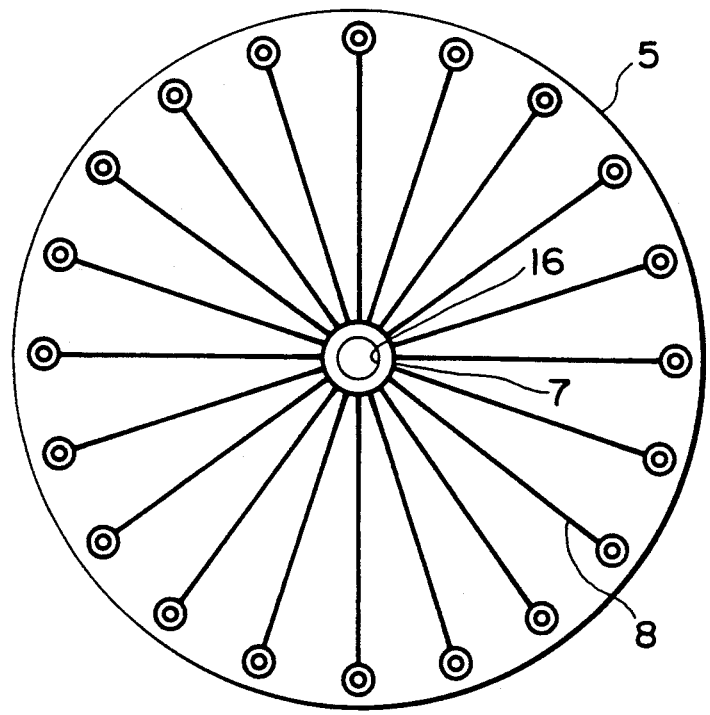
FIG. 12 is a plane view of radial arrangement of ground conductors printed on a selected layer of the bus-printed board.
Figure 13:
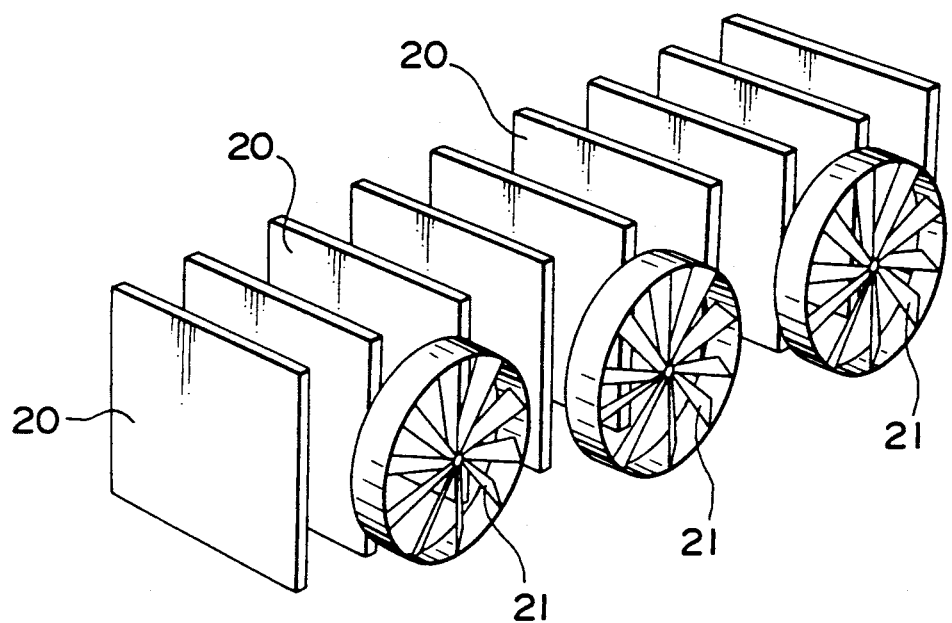
FIG. 13 is a perspective view of a conventional arrangement of CPU boards standing upright and arranged side by side.

FIGS. 11 and 12 show another patterns of signal conductors 6 and ground conductors 8. As shown, each common center contact 7 is a small ring whose aperture 16 permits insertion of a support rod to hold a bus-printed disk 5.

In this particular embodiment the signal path between selected CPU boards cannot be exactly same, but can be substantially twice as long as a radial signal conductor.

As may be understood from the above, the radial arrangement of signal conductors in a parallel system bus according to the present invention permits connection of selected CPU boards via equal length of signal path, no matter how many CPU boards may be used. Therefore, no timed control is required in transmission of signals between selected CPU boards via the bus, and accordingly communication speed will be increased to meet highly functional computer's requirements.

Signal conductors can be printed on a relatively small disk at an increased density. Accordingly, the space occupied by the bus may be reduced.

Parallel arrangement of ground conductors in registration with signal conductors at different levels provides effective electromagnetic shielding, thereby preventing leakage of signals and eliminating adverse effect by noise signals.

Air-conditioning fans below and/or above the bus disk column permit even cooling of the CPU boards surrounding the bus disk column to keep them at equal temperature.

What is claimed is:

1. A radial type of parallel system bus structure comprising:
    a plurality of bus wire-printed boards mounted in spaced, parallel relationship and having a common central axis, each of said boards having an outer edge and having a plurality of signal conductors of equal length extending radially from a common contact center, a plurality of stationary connectors mounted adjacent to and spaced around said board outer edges and connected to said signal conductors, each of said stationary connectors including connecting means connecting said signal conductors to conductors on CPU boards, and all signal conductors of each of said bus wire-printed boards being connected to all CPU boards.

2. A radial type of parallel system bus structure according to claim 1 wherein at least one bus wire-printed board is composed of a plurality of layers each bearing a plurality of signal conductors and a common contact center connected thereto.

3. A radial type of parallel system bus structure according to claim 1 or 2 wherein each bus wire-printed board has a dielectric layer bearing a plurality of ground conductors embedded within its undersurface, extending parallel to the signal conductors on its uppersurface.

4. A radial type of parallel system bus structure according to claim 1 wherein it further comprises at least one air conditioning fan above or below a vertical arrangement of said bus wire-printed boards on its central axis.

* * * * *